US010299043B2

(12) United States Patent
Guo et al.

(10) Patent No.: US 10,299,043 B2
(45) Date of Patent: May 21, 2019

(54) METHOD FOR REPROCESSING VIBRATING DIAPHRAGM, VIBRATING DIAPHRAGM AND TELEPHONE RECEIVER

(71) Applicant: Goertek Inc., Weifang (CN)

(72) Inventors: Xiaodong Guo, Weifang (CN); Fenglei Zu, Weifang (CN)

(73) Assignee: Goertek Inc., Weifang (CN)

( * ) Notice: Subject to any disclaimer, the term of this patent is extended or adjusted under 35 U.S.C. 154(b) by 0 days.

(21) Appl. No.: 15/507,605

(22) PCT Filed: Dec. 18, 2015

(86) PCT No.: PCT/CN2015/097962

§ 371 (c)(1),
(2) Date: Feb. 28, 2017

(87) PCT Pub. No.: WO2016/165377

PCT Pub. Date: Oct. 20, 2016

(65) Prior Publication Data

US 2017/0289689 A1 Oct. 5, 2017

(30) Foreign Application Priority Data

Apr. 14, 2015 (CN) .......................... 2015 1 0175740

(51) Int. Cl.
*H01L 41/22* (2013.01)
*H04R 7/04* (2006.01)
(Continued)

(52) U.S. Cl.
CPC ................ *H04R 7/04* (2013.01); *H04R 1/10* (2013.01); *H04R 7/16* (2013.01); *H04R 7/18* (2013.01);
(Continued)

(58) Field of Classification Search
CPC combination set(s) only.
See application file for complete search history.

(56) References Cited

U.S. PATENT DOCUMENTS

2003/0048914 A1* 3/2003 Yi ......................... H04R 17/00 381/190
2003/0132683 A1* 7/2003 Yamada ................. C23C 14/10 310/346
(Continued)

FOREIGN PATENT DOCUMENTS

CN 1455618 A 11/2003
CN 1494354 A 5/2004
(Continued)

OTHER PUBLICATIONS

The State Intellectual Property Office of The People'S Republic of China, Office Action in Chinese Patent Application No. 201510175740.3 dated Aug. 1, 2017.
(Continued)

*Primary Examiner* — Amir H Etesam
(74) *Attorney, Agent, or Firm* — LKGlobal | Lorenz & Kopf, LLP

(57) ABSTRACT

The present application discloses a method for reprocessing a vibrating diaphragm, a vibrating diaphragm and a telephone receiver. The method for reprocessing a vibrating diaphragm involves the use of a vibrating diaphragm that includes a plane portion located at a center, a corrugated rim portion disposed at an edge of the plane portion, and a fixing portion connected to a periphery of the corrugated rim portion to bond a housing. The method includes, but is not limited to performing surface sputtering on part of an area of the corrugated rim portion by using a magnetron sputtering technology.

5 Claims, 4 Drawing Sheets

(51) Int. Cl.

| | |
|---|---|
| ***H04R 1/10*** | (2006.01) |
| ***H04R 31/00*** | (2006.01) |
| ***H04R 7/16*** | (2006.01) |
| ***H04R 7/18*** | (2006.01) |
| ***H04R 7/24*** | (2006.01) |

(52) U.S. Cl.
CPC ............... *H04R 7/24* (2013.01); *H04R 31/00* (2013.01); *H04R 31/003* (2013.01)

(56) References Cited

U.S. PATENT DOCUMENTS

| | | | |
|---|---|---|---|
| 2007/0178242 | A1 | 8/2007 | Amon et al. |
| 2008/0277197 | A1 | 11/2008 | Yang et al. |

FOREIGN PATENT DOCUMENTS

| | | | |
|---|---|---|---|
| CN | 2653829 | Y | 11/2004 |
| CN | 1922923 | A | 2/2007 |
| CN | 101304622 | A | 11/2008 |
| CN | 102206805 | A | 10/2011 |
| CN | 203301721 | U | 11/2013 |
| CN | 104507020 | A | 4/2015 |
| CN | 104918201 | A | 9/2015 |
| CN | 204836474 | U | 12/2015 |
| JP | S6139800 | A | 2/1986 |
| TW | 200518614 | A | 6/2005 |
| WO | 2013141369 | A | 9/2013 |

OTHER PUBLICATIONS

International Bureau of WIPO, International Search Report and Written Opinion in Application No. PCT/CN2015/097962, dated Mar. 11, 2016.

The State Intellectual Property Office of The People's Republic of China, Office Action in Chinese Patent Application No. 201510175740.3 dated Apr. 20, 2018.

The State Intellectual Property Office of the People's Republic of China, Office Action in Chinese Patent Application No. 201510175740.3 dated Oct. 8, 2018.

* cited by examiner

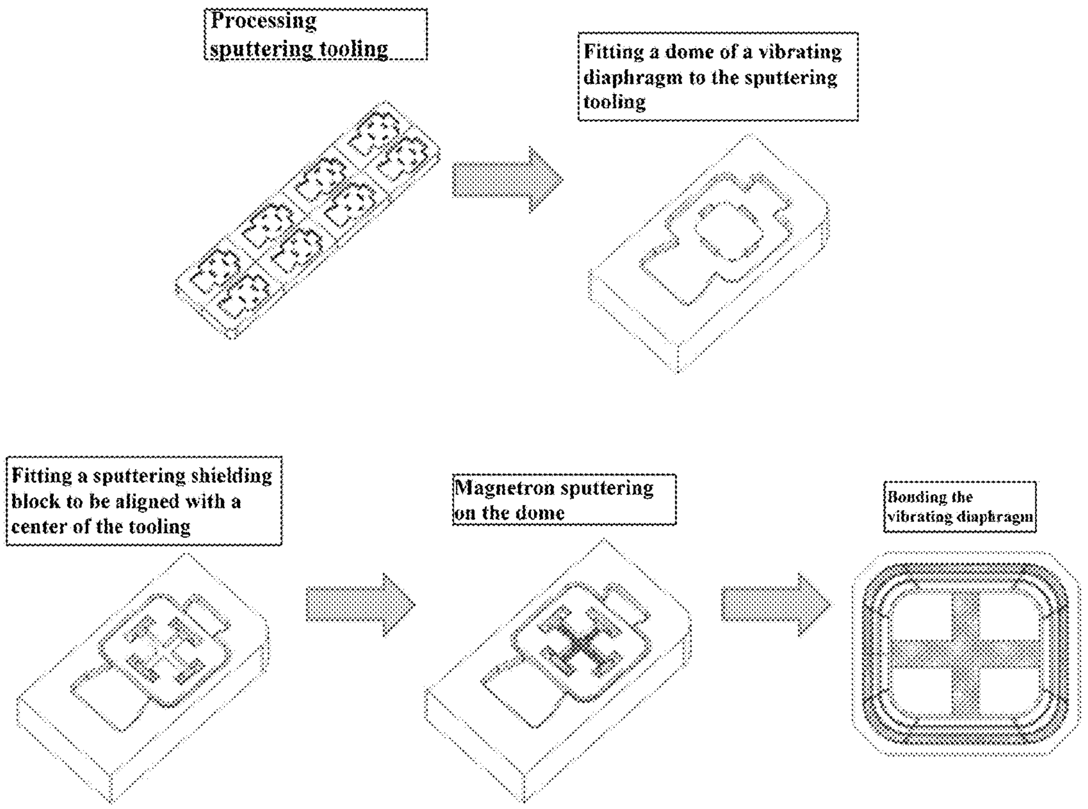
Fig. 3
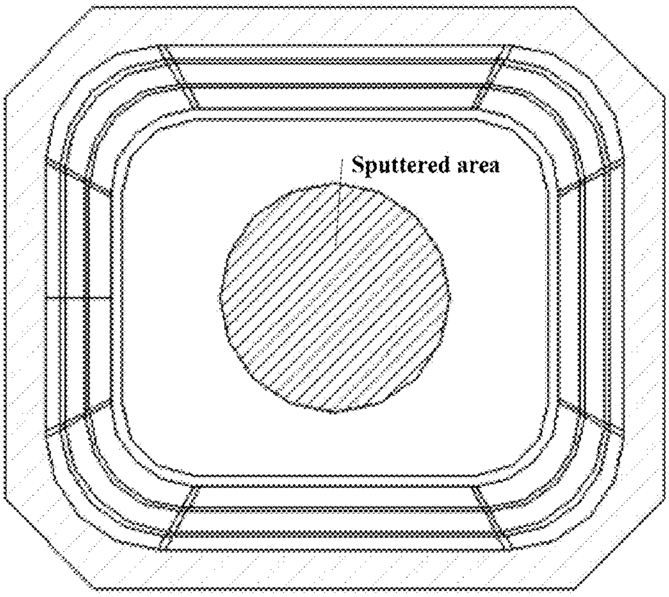
Fig. 4-a

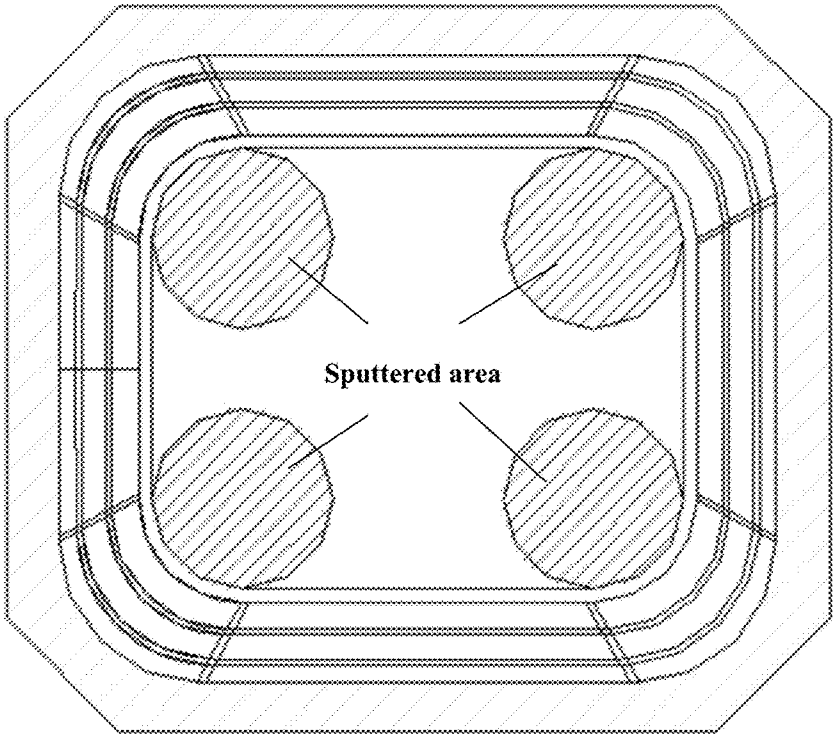
Fig. 4-b
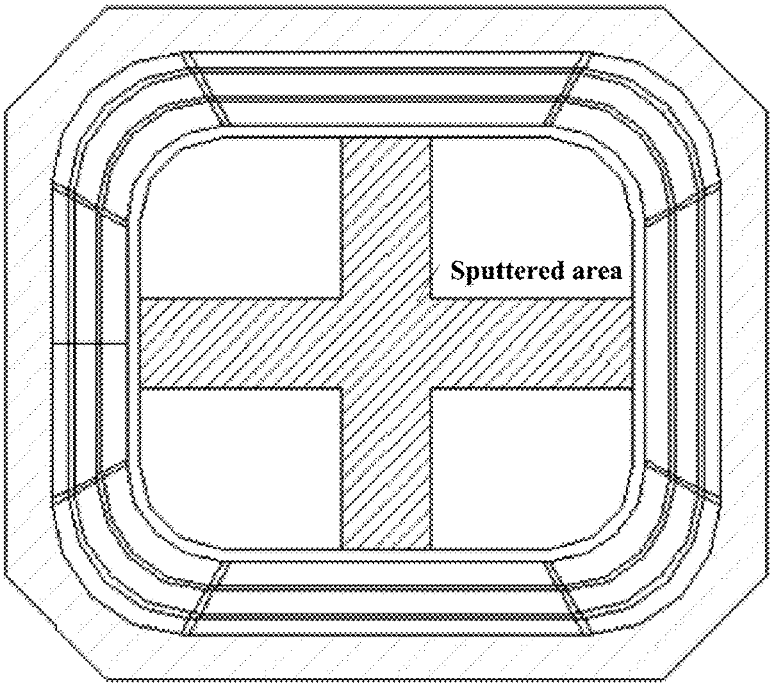
Fig. 4-c

METHOD FOR REPROCESSING VIBRATING DIAPHRAGM, VIBRATING DIAPHRAGM AND TELEPHONE RECEIVER

CROSS-REFERENCE TO RELATED APPLICATION

This application is a U.S. National-Stage entry under 35 U.S.C. § 371 based on International Application No. PCT/CN2015/097962, filed Dec. 18, 2015, which was published under PCT Article 21(2) and which claims priority to Chinese Application No. 201510175740.3, filed Apr. 14, 2015, which are all hereby incorporated herein in their entirety by reference.

TECHNICAL FIELD

This application pertains to the technical field of electro-acoustic products, and particularly, to a method for reprocessing a vibrating diaphragm, a vibrating diaphragm and a telephone receiver.

BACKGROUND

With the gradually decreasing of the size of telephone receivers, vibrating diaphragms have to be designed as being softer to meet the requirement of low frequency acoustic quality. However, the softer vibrating diaphragm aggravates the polarization of the vibrating system, and it is more difficult to control the distortion and clutter.

As the size of telephone receivers is constantly decreased, the conventional design of vibrating diaphragms cannot simultaneously meet the requirements of low frequency acoustic quality and suppressing system polarization.

In addition, other objects, desirable features and characteristics will become apparent from the subsequent summary and detailed description, and the appended claims, taken in conjunction with the accompanying drawings and this background.

SUMMARY

In view of the above problem, the present application is proposed to provide a method for reprocessing a vibrating diaphragm, a vibrating diaphragm and a telephone receiver, which can overcome or at least partially solve the above problem. The technical solutions of the present application are realized as follows:

In one aspect, an embodiment of the present application provides a method for reprocessing a vibrating diaphragm, the vibrating diaphragm comprising a plane portion located at a center, a corrugated rim portion disposed at an edge of the plane portion, and a fixing portion connected to a periphery of the corrugated rim portion to bond a housing, wherein the method comprises performing surface sputtering on part of an area of the corrugated rim portion by using a magnetron sputtering technology.

Preferably, the performing surface sputtering on part of an area of the corrugated rim portion by using a magnetron sputtering technology comprises:

hollowing out a center position of a vibrating diaphragm to be sputtered;

fitting the vibrating diaphragm on a first sputtering tooling through the hollowed-out structure;

fitting and positioning a first sputtering shielding member to the vibrating diaphragm, the first sputtering shielding member being used to shield the plane portion of the vibrating diaphragm and a part of the corrugated rim portion close to the plane portion; and placing the shielded vibrating diaphragm into a magnetron sputtering device for surface sputtering treatment.

Preferably, a dome portion is bonded to the plane portion of the vibrating diaphragm, and the method further comprises:

performing surface sputtering on part of an area of the dome portion by using the magnetron sputtering technology.

Preferably, the performing surface sputtering on part of an area of the dome portion by using the magnetron sputtering technology comprises:

designing a sputtered area of the dome portion according to an acoustic performance requirement;

designing a hollowed-out area of a second sputtering shielding member according to the sputtered area to ensure that only the hollowed-out area is subject to the sputtering; fitting and fixing the dome portion to a second sputtering tooling;

fitting and positioning the second sputtering shielding member to the dome portion; and placing the shielded dome portion into a magnetron sputtering device for surface sputtering.

Preferably, the designing a sputtered area of the dome portion according to an acoustic performance requirement comprises:

the sputtered area being a circular area located at a center of the dome portion;

or, the sputtered area being circular areas located at four corners of the dome portion;

or, the sputtered area being a cross-shaped area located at the center of the dome portion.

Preferably, a sputtering material used in the magnetron sputtering technology comprises iron powder or liquid gel mixed with iron powder.

By performing surface sputtering on part of an area of the corrugated rim portion of the vibrating diaphragm, the present technical solution can enhance the rigidity of the corrugated rim portion, and then increase the support force of the corrugated rim portion, thereby achieving the purpose of suppressing the polarization of the system without influencing the low frequency acoustic quality of the system.

By performing surface sputtering on the dome portion of the vibrating diaphragm, the preferred embodiment improves the strength of a local area of the dome portion with a minimum increase of the weight of the vibrating system.

In another aspect, an embodiment of the present application provides a vibrating diaphragm, comprising a plane portion located at a center, a corrugated rim portion disposed at an edge of the plane portion, and a fixing portion connected to a periphery of the corrugated rim portion to bond a housing, wherein part of an area of the corrugated rim portion has been surface sputtered by using a magnetron sputtering technology.

Preferably, the vibrating diaphragm further comprises a dome portion bonded to the plane portion, and part of an area of the dome portion has been surface sputtered by using a magnetron sputtering technology.

Preferably, the vibrating diaphragm is characterized by when the part of the area of the dome portion is being surface sputtered, designing a sputtered area of the dome portion according to an acoustic performance requirement, the sputtered area being a circular area located at a center of the dome portion;

or, being circular areas located at four corners of the dome portion;

or, being a cross-shaped area located at the center of the dome portion.

By performing surface sputtering on part of an area of the corrugated rim portion of the vibrating diaphragm, the present technical solution can enhance the rigidity of the corrugated rim portion, and then increase the support force of the corrugated rim portion, thereby achieving the purpose of suppressing the polarization of the system without influencing the low frequency acoustic quality of the system.

By performing surface sputtering on part of an area of the dome portion of the vibrating diaphragm, the preferred embodiment improves the strength of a local area of the dome portion with a minimum increase of the weight of the vibrating system.

In another aspect, an embodiment of the present application provides a telephone receiver, comprising an upper casing and a lower casing, a cavity enclosed by the upper casing and the lower casing accommodating a vibrating system, wherein a vibrating diaphragm of the vibrating system comprises the corrugated rim portion and the dome portion provided by the above technical solutions.

The telephone receiver of the present technical solution, by performing surface sputtering on the corrugated rim portion of the vibrating diaphragm in the vibrating system, can increase the support force of the corrugated rim portion and suppress the polarization of the system without influencing the low frequency acoustic quality of the system. In addition, by performing surface sputtering on the dome portion of the vibrating diaphragm, the telephone receiver improves the strength of a local area of the dome portion with a minimum increase of the weight of the vibrating system, so as to improve the high frequency response characteristic of the telephone receiver and reduce the harmonic distortion.

The above descriptions are just generalizations of the technical solutions of the present application, and in order to understand the technical means of the present application more clearly, the specific embodiments of the present application are illustrated as follows.

BRIEF DESCRIPTION OF THE DRAWINGS

The present invention will hereinafter be described in conjunction with the following drawing figures, wherein like numerals denote like elements, and:

FIG. 3 is a procedure diagram of surface sputtering treatment on part of an area of a dome portion provided by an embodiment of the present application;

FIG. 4-*a* is a schematic diagram of a circular sputtered area at a center of a dome portion provided by an embodiment of the present application;

FIG. 4-*b* is a schematic diagram of circular sputtered areas at corners of a dome portion provided by an embodiment of the present application;

FIG. 4-*c* is a schematic diagram of a cross-shaped sputtered area at a center of a dome portion provided by an embodiment of the present application;

In that,

1-plane portion, 2-corrugated rim portion, 3-fixing portion, 4-dome portion, 5-upper casing, 6-vibrating diaphragm, 7-voice coil, 8-washer, 9-magnet, 10-frame, 11-lower casing.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

With respect to the situation that the size of telephone receivers is constantly decreased, and the conventional designs of vibrating diaphragms cannot simultaneously meet the requirements of low frequency acoustic quality and suppressing system polarization, the present application suppresses the vibrating diaphragm polarization by increasing the local rigidity of the corrugated rim area of the vibrating diaphragm without influencing the low frequency performance of the product, and suppresses the system polarization by an optimization design without influencing the low frequency acoustic quality.

The technical status that a block or local optimization of vibrating diaphragms cannot be realized is caused by the limitation to the material selection for the vibrating diaphragms of telephone receivers. The present technical solution employs a magnetron sputtering process to reprocess part of an area of the corrugated rim of the vibrating diaphragm, so as to accurately enhance the local rigidity of the vibrating diaphragm, and improve the ability of the vibrating diaphragm to suppress the system polarization.

The magnetron sputtering method is a process that controls the sputtering of metal powder and liquid on a surface of a workpiece to be processed by a magnetic field, and it has the characteristics of high accuracy, easy control, etc. In order that the objectives, technical solutions and advantages of the present application are clearer, the embodiments of the present application will be further described below in details with reference to the drawings.

Figure 1:
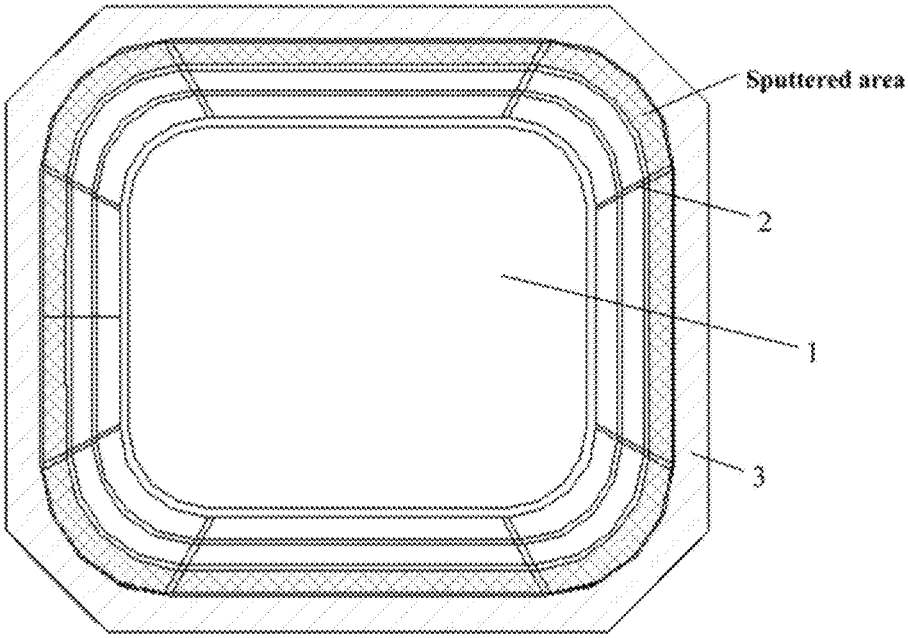
FIG. 1 is an appearance diagram of a surface sputtered vibrating diaphragm provided by an embodiment of the present application.

FIG. 1 is an appearance diagram of a surface sputtered vibrating diaphragm provided by an embodiment of the present application. The vibrating diaphragm comprises a plane portion 1 located at a center, a corrugated rim portion 2 disposed at an edge of the plane portion 1, and a fixing portion 3 connected to a periphery of the corrugated rim portion 2 to bond a housing.

An embodiment of the present application provides a method for reprocessing a vibrating diaphragm, comprising: performing surface sputtering on part of an area of the corrugated rim portion by using a magnetron sputtering technology. To be noted, in order for sputtering, the sputtering tooling should be preprocessed. In order to distinguish different sputtering toolings from each other, the embodiment of the present application denominates the sputtering tooling for the sputtering on the corrugated rim portion of the vibrating diaphragm as first sputtering tooling, and denominates the sputtering tooling for the sputtering on the dome portion of the vibrating diaphragm as second sputtering tooling, wherein "first" and "second" are only employed for the distinguishing, rather than indicating any order.

Figure 2:
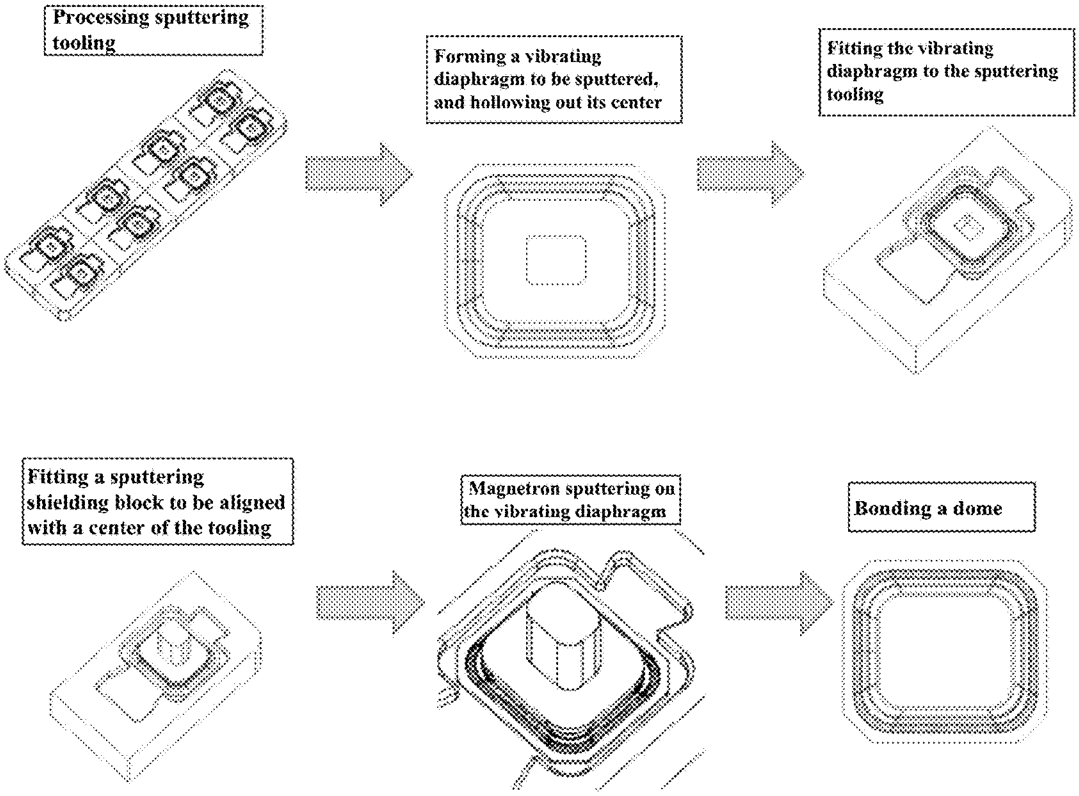
FIG. 2 is a procedure diagram of surface sputtering treatment on part of an area of a corrugated rim portion provided by an embodiment of the present application.

As illustrated in FIG. 2, FIG. 2 is a procedure diagram of surface sputtering treatment on part of an area of a corrugated rim portion provided by an embodiment of the present application, and the specific procedure of the performing surface sputtering on part of an area of the corrugated rim portion by using a magnetron sputtering technology is:

S11: hollowing out a center position of a vibrating diaphragm to be sputtered, to obtain a shaped vibrating diaphragm to be sputtered.

S12: fitting the vibrating diaphragm to be sputtered on a first sputtering tooling through the hollowed-out structure. In practical applications, the first sputtering tooling may be used to fit a plurality of vibrating diaphragms to be sputtered at one time.

S13: fitting and positioning a first sputtering shielding member to the vibrating diaphragm to complete an alignment with the center of the first sputtering tooling. The first sputtering shielding member is used to shield the plane portion of the vibrating diaphragm and a part of the corrugated rim portion close to the plane portion.

S14: placing the shielded vibrating diaphragm into a magnetron sputtering device for surface sputtering treatment.

S15: taking the vibrating diaphragm after the surface sputtering out of the magnetron sputtering device, and bonding a dome portion of the vibrating diaphragm to the plane portion of the vibrating diaphragm.

To be noted, FIG. 2 schematically illustrates the vibrating diaphragm with the plane portion and a part of the corrugated rim portion close to the plane portion having been shielded, and the vibrating diaphragm to be sputtered only has an annular outer side of the corrugated rim portion exposed, so that the surface sputtering is merely performed on a ring area on the outer side of the corrugated rim portion of the vibrating diaphragm. By increasing the local rigidity of the corrugated rim portion, and in turn increasing the support force of the corrugated rim portion, the method solves the problem of system polarization due to the insufficient support force of the corrugated rim portion of the vibrating diaphragm. Obviously, in practical applications, the first sputtering shielding member for shielding the plane portion and a part of the corrugated rim portion close to the plane portion may be designed according to the acoustic performance requirement.

To be further noted, the present embodiment includes but is not limited to the first sputtering tooling illustrated in FIG. 2, provided that the sputtering tooling assists the vibrating diaphragm to be sputtered to complete the surface sputtering on a specified area of the vibrating diaphragm at the magnetron sputtering device.

In the present embodiment, the sputtered area and the size of the corrugated rim portion of the vibrating diaphragm are controlled by the first sputtering tooling, while the sputtering material thickness, the sputtering intensity and the sputtering duration are controlled by the magnetron sputtering device.

By the magnetron sputtering technology, the present embodiment can accurately control the rigidity of the area of the corrugated rim portion of the vibrating diaphragm to be increased, effectively improve the support force of the corrugated rim portion of the vibrating diaphragm without influencing the compliance of the vibrating diaphragm as far as possible, and then suppress the system polarization.

In a telephone receiver module, the strength of the dome portion of the vibrating diaphragm should be increased in order to improve the high frequency response characteristic and reduce the harmonic distortion. But when the strength of the dome portion is to be increased, usually one has to increase the material thickness and add new composite material, which both certainly lead to the increase of the weight of the vibrating system.

In that, patterning the dome portion is a common method for enhancing the strength of the dome portion without increasing the weight of the dome portion; but the method is restricted by the material of the dome portion, and the increment of the strength is limited.

The present application, by performing surface treatment to the dome portion of the vibrating diaphragm by using the magnetron sputtering method, can achieve a maximum increase of the strength of the dome portion with a minimum increase of the weight. Based on the treatment, the sputtered area of the dome portion of the vibrating diaphragm can be designed to meet different acoustic performance requirements. For example, in order to solve the problem of high frequency and suppress the division vibration of the dome portion, a circular sputtered area may be designed at the center of the dome portion, and in order to solve the problem of harmonic distortion, the four corners or the central cross-shaped area of the dome portion may be selected to be enhanced according to the system polarization condition. Meanwhile, different sputtering materials can achieve different local enhancement effects of the dome portion, e.g., iron powder may be used to increase the strength, and liquid gel mixed with iron powder may be used to increase the local damping of the dome portion.

In order to increase the strength of the dome portion of the vibrating diaphragm, after performing surface sputtering on part of an area of the corrugated rim portion of the vibrating diaphragm by using the magnetron sputtering technology, the present technical solution, by performing surface sputtering on part of an area of the dome portion of the vibrating diaphragm by using the magnetron sputtering technology, bonds the dome portion after the surface sputtering onto the plane portion of the vibrating diaphragm.

Specifically, the method for reprocessing a vibrating diaphragm further comprises: performing surface sputtering on part of an area of the dome portion by using the magnetron sputtering technology.

As illustrated in FIG. 3, which is a procedure diagram of surface sputtering treatment on part of an area of a dome portion provided by an embodiment of the present application, before performing the surface sputtering on the dome portion, the method firstly designs a sputtered area of the dome portion according to an acoustic performance requirement, and designs a hollowed-out area of a second sputtering shielding member according to the sputtered area to ensure that only the hollowed-out area is subject to the sputtering.

The sputtered area in the present embodiment may be a circular area located at a center of the dome portion, as illustrated in FIG. 4-*a*, and the diagonal polarization of the system is suppressed by providing the circular sputtered area at the center of the dome portion. In this step, the sputtered area may also be circular areas located at four corners of the dome portion, as illustrated in FIG. 4-*b*, and the straight-side polarization of the system is suppressed by providing the circular sputtered areas at the four corners of the dome portion. In this step, the sputtered area may further be a cross-shaped area located at the center of the dome portion, as illustrated in FIG. 4-*c*, and the division vibration of the system is suppressed by providing the cross-shaped sputtered area at the center of the dome portion. Obviously, the forms of the sputtered area may be various, and the present technical solution includes but is not limited to the above three forms of the sputtered area.

The second sputtering tooling is preprocessed. The specific procedure of the performing surface sputtering on part of an area of the dome portion by using the magnetron sputtering technology is:

S21: fitting and fixing the dome portion to a second sputtering tooling.

S22: fitting and positioning the second sputtering shielding member to the dome portion to complete an alignment with the center of the second sputtering tooling.

S23: placing the shielded dome portion into a magnetron sputtering device for surface sputtering.

S24: taking the dome portion after the surface sputtering out of the magnetron sputtering device, and bonding the dome portion to the plane portion of the vibrating diaphragm.

To be noted, the present embodiment includes but is not limited to the second sputtering tooling as illustrated in FIG. 3, provided that the sputtering tooling assists the dome portion needing sputtering to complete the surface sputtering on a specified area of the dome portion at the magnetron sputtering device.

In the present embodiment, the sputtered area and the size of the dome portion of the vibrating diaphragm are controlled by the second sputtering tooling, while the sputtering material thickness, the sputtering intensity and the sputtering duration are controlled by the magnetron sputtering device.

By performing surface sputtering on the dome portion of the vibrating diaphragm by using the magnetron sputtering, the present technical solution achieves a maximum increase of the strength of the dome portion with a minimum increase of the weight of the vibrating system. The present embodiment has a highly-accurate controllability and can locally increase the strength of the dome portion, so that the enhancement mode is more targeting. In addition, the selection range of sputtering material is wide, which is suitable for dome portion designs of different purposes.

In practical applications, when the surface sputtering is performed on the part of the area of the corrugated rim portion and the part of the area of the dome portion of the vibrating diaphragm, different sputtering materials may be selected according to the acoustic performance requirement, such as iron powder or liquid gel mixed with iron powder.

To be noted, since the magnetron sputtering technology is a process conducted by magnetic field to perform material surface treatment, the sputtering material must be a metal material attractable by magnets.

Based on the same technical conception as the method for reprocessing a vibrating diaphragm, an embodiment of the present application further provides a vibrating diaphragm, comprising a plane portion located at a center, a corrugated rim portion disposed at an edge of the plane portion, and a fixing portion connected to a periphery of the corrugated rim portion to bond a housing, wherein part of an area of the corrugated rim portion has been surface sputtered by using a magnetron sputtering technology to enhance the local rigidity of the corrugated rim portion.

In a preferred embodiment of the embodiment, part of an area of the dome portion of the vibrating diaphragm has been surface sputtered by using a magnetron sputtering technology.

When the surface sputtering is performed on part of an area of the dome portion, the sputtered area of the dome portion may be designed according to the acoustic performance requirement, and the sputtered area may be a circular area located at a center of the dome portion, or be circular areas located at four corners of the dome portion, or be a cross-shaped area located at the center of the dome portion.

By performing surface sputtering on part of an area of the corrugated rim portion of the vibrating diaphragm, the present embodiment can enhance the rigidity of the corrugated rim portion, and then increase the support force of the corrugated rim portion, thereby achieving the purpose of suppressing the polarization of the system without influencing the low frequency acoustic quality of the system.

By performing surface sputtering on part of an area of the dome portion of the vibrating diaphragm, the preferred embodiment improves the strength of a local area of the dome portion with a minimum increase of the weight of the vibrating system.

An embodiment of the present application further provides a telephone receiver, comprising an upper casing and a lower casing, a cavity enclosed by the upper casing and the lower casing accommodating a vibrating system including the vibrating diaphragm and the dome portion provided by the above technical solution.

Figure 5:
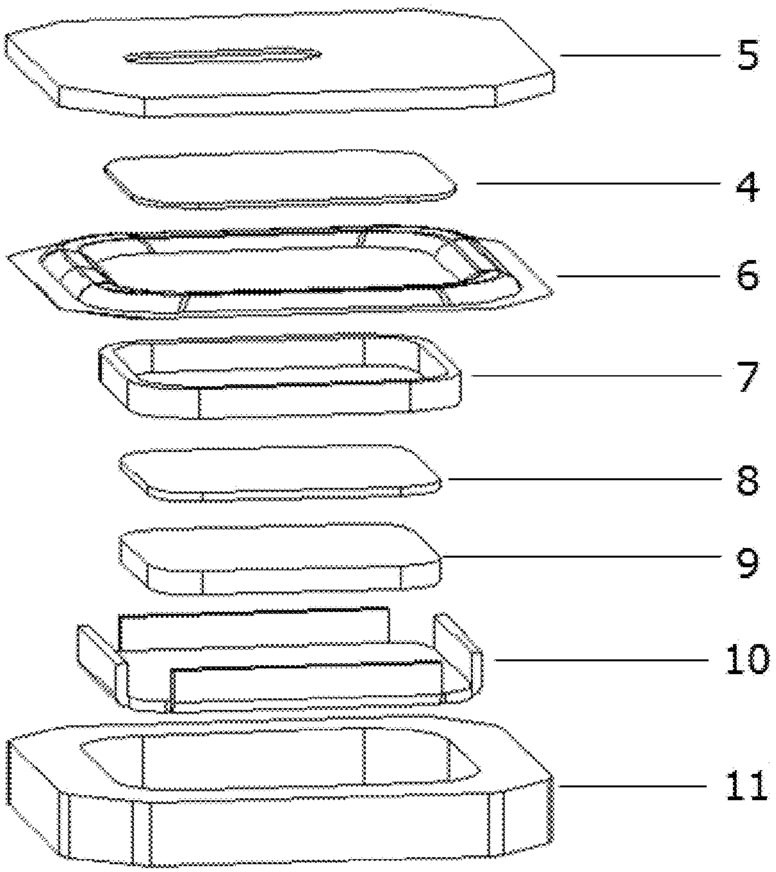
FIG. 5 is a structural diagram of compositions of a telephone receiver provided by an embodiment of the present application.
Figure 6:
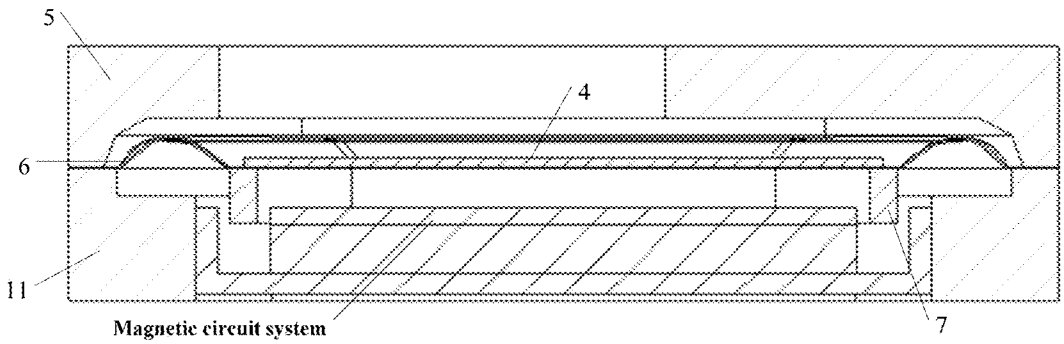
FIG. 6 is a cross-sectional side view of a telephone receiver provided by an embodiment of the present application.

Specifically, as illustrated in FIGS. 5 and 6, which are structural diagrams of compositions of a telephone receiver provided by an embodiment of the present application, the telephone receiver comprises a vibrating system, a magnetic circuit system and an auxiliary system.

The auxiliary system comprises an upper casing 5 and a lower casing 11 jointed together, a cavity enclosed by the upper casing 5 and the lower casing 11 accommodating the vibrating system and the magnetic circuit system.

The magnetic circuit system comprises a vibrating diaphragm 6, a voice coil 7 fixed to one side of the vibrating diaphragm 6, and a dome portion 4 fixed to the plane portion of the vibrating diaphragm 6, wherein the voice coil 7 and the dome portion 4 may be fixed on the same side of the vibrating diaphragm 6, or two sides of the vibrating diaphragm 6 individually, and wherein part of an area of the corrugated rim portion of the vibrating diaphragm 6 has been surface sputtered by using a magnetron sputtering technology to enhance the local rigidity of the corrugated rim portion, and part of an area of the dome portion 4 has been surface sputtered by using a magnetron sputtering technology to enhance the local rigidity of the dome portion.

The magnetic circuit system comprises a frame 10 fixed to the lower casing 11, wherein a magnet 9 is disposed at a center position of the frame 10 close to the upper casing 5, and a washer 8 is disposed on a side of the magnet 9 far away from the frame 10.

By performing surface sputtering on the corrugated rim portion of the vibrating diaphragm in the vibrating system, the telephone receiver of the present embodiment can increase the support force of the corrugated rim portion and suppress the polarization of the system without influencing the low frequency acoustic quality of the system. In addition, by performing surface sputtering on the dome portion of the vibrating diaphragm, the telephone receiver improves the strength of a local area of the dome portion with a minimum increase of the weight of the vibrating system, so as to improve the high frequency response characteristic of the telephone receiver and reduce the harmonic distortion.

In conclusion, the embodiments of the present application provide a method for reprocessing a vibrating diaphragm, a vibrating diaphragm and a telephone receiver. The vibrating diaphragm comprises a plane portion located at a center, a corrugated rim portion disposed at an edge of the plane portion, and a fixing portion connected to a periphery of the corrugated rim portion to bond a housing. In the method for reprocessing a vibrating diaphragm, by performing surface sputtering on part of an area of the corrugated rim portion by using the magnetron sputtering technology, the method can enhance the local rigidity of the corrugated rim portion, and then increase the support force of the corrugated rim portion, thereby achieving the purpose of suppressing the polarization of the system without influencing the low frequency acoustic quality of the system. By performing surface sputtering on the dome portion of the vibrating diaphragm, the preferred embodiment improves the strength of a local area of the dome portion with a minimum increase of the weight of the vibrating system.

The above descriptions are just preferred embodiments of the present application, rather than limitations to the protection scope of the present application. Any amendment, equivalent replacement, improvement, etc. made within the spirit and principle of the present application shall fall within the protection scope of the present application. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

The invention claimed is:

1. A method for reprocessing a vibrating diaphragm, the vibrating diaphragm comprising a plane portion located at a center, a corrugated rim portion disposed at an edge of the plane portion, and a fixing portion connected to a periphery of the corrugated rim portion to bond a housing, wherein the method comprises performing surface sputtering on part of an area of the corrugated rim portion by using a magnetron sputtering technology, wherein the performing surface sputtering on part of an area of the corrugated rim portion by using a magnetron sputtering technology comprises:

hollowing out a center position of a vibrating diaphragm to be sputtered;

fitting the vibrating diaphragm on a first sputtering tooling through the hollowed-out structure;

fitting and positioning a first sputtering shielding member to the vibrating diaphragm, the first sputtering shielding member being used to shield the plane portion of the vibrating diaphragm and a part of the corrugated rim portion close to the plane portion; and placing the shielded vibrating diaphragm into a magnetron sputtering device for surface sputtering treatment.

2. The method according to claim 1, wherein a dome portion is bonded to the plane portion of the vibrating diaphragm, and the method further comprises:

performing surface sputtering on part of an area of the dome portion by using the magnetron sputtering technology.

3. The method according to claim 2, wherein the performing surface sputtering on part of an area of the dome portion by using the magnetron sputtering technology comprises:

designing a sputtered area of the dome portion according to an acoustic performance requirement;

designing a hollowed-out area of a second sputtering shielding member according to the sputtered area to ensure that only the hollowed-out area is subject to the sputtering;

fitting and fixing the dome portion to a second sputtering tooling;

fitting and positioning the second sputtering shielding member to the dome portion; and placing the shielded dome portion into a magnetron sputtering device for surface sputtering.

4. The method according to claim 3, wherein the designing a sputtered area of the dome portion according to an acoustic performance requirement comprises:

the sputtered area being a circular area located at a center of the dome portion;

or, the sputtered area being circular areas located at four corners of the dome portion;

or, the sputtered area being a cross-shaped area located at the center of the dome portion.

5. The method according to claim 4, wherein a sputtering material used in the magnetron sputtering technology comprises iron powder or liquid gel mixed with iron powder.

* * * * *